United States Patent [19]

Nemoto

[11] Patent Number: 5,418,692
[45] Date of Patent: May 23, 1995

[54] TRAY FOR SEMICONDUCTOR DEVICES
[75] Inventor: Hisashi Nemoto, Tokyo, Japan
[73] Assignee: Shinon Denkisangyo Kabushiki-Kaisha, Tokyo, Japan
[21] Appl. No.: 294,112
[22] Filed: Aug. 22, 1994
[51] Int. Cl.⁶ ............................................. H05K 7/02
[52] U.S. Cl. .................................. 361/809; 174/52.1; 206/328; 206/330; 206/331
[58] Field of Search .................. 361/730, 774, 809; 174/52.1, 52.4; 206/330–331, 328

[56] References Cited
U.S. PATENT DOCUMENTS
4,654,693  3/1987  Funakoshi et al. ................ 174/52.4

Primary Examiner—Bot LeDynh
Attorney, Agent, or Firm—Frishauf, Holtz, Goodman & Woodward

[57] ABSTRACT

A tray for semiconductor devices is used by piling up another tray or other trays on this tray. Rectangular pockets are formed on the upper surface of the trays and each of the pockets houses a semiconductor device. A base projects upward from each pocket to support each semiconductor device. The base has a similar shape to and is larger than the undersurface of the semiconductor device. Parallel guide ribs are formed on the undersurface of each tray and each is provided with an tapered inner face inclined downward outward of the base. The roots of the adjacent guide ribs define a portion of the undersurface of the trays which has a similar shape to and is smaller than the upper surface of the semiconductor device. The guide ribs are arranged to provide a horizontal play between the outer edge portions on the upper surface of the semiconductor device and the tapered inner face. An upwardly projecting holding mechanism extends along the outer edge portions. Its root portions surround a portion of the upper surface of the base which has a similar shape to and is not smaller than the undersurface of the semiconductor device. The projecting holding mechanism is arranged to cause the bottom portion of the semiconductor device to be fitted in the portion of the base surrounded by the upwardly projecting holding mechanism.

10 Claims, 5 Drawing Sheets

TRAY FOR SEMICONDUCTOR DEVICES

BACKGROUND OF THE INVENTION

1. Field of the Invention

The present invention relates to a tray for Housing semiconductor devices such ICs, and more particularly to a tray suited for housing semiconductor devices having leads on every lateral side.

2. Description of the Prior Art

As the semiconductors such as ICs have been integrated more and more, they have become miniaturized more and more and thinner and thinner. Thus, it has become necessary to apply as small vertical loads and external shocks as possible to the devices, and the structure of the trays greatly influences the yield of the semiconductor devices.

Many semiconductor devices have extremely wi ring leads consisting of extremely thin metal wires extending externally from the semiconductor devices, and such a problem arises that leads are likely to be deformed or bent when the leads contact the corresponding inner walls of the pockets or the like in a tray.

Conventionally, trays for semiconductor devices whose cross sections are shown in FIGS. 8a and 8b are used in order to prevent the leads of the device from contacting the inner walls of the trays.

Each of trays 26, piled up as shown in FIG. 8a, is provided with pressing ribs 27 on its undersurface. The pressing ribs 27 of the upper tray 26 press semiconductor devices 29 in the pockets 28 of the lower tray 26 from above so that it is tried not to move but to fix the devices 29.

Each of trays 30, piled up as shown in FIG. 8b, is provided with pressing ribs 31 on its undersurface. A step portion 32 is formed in the inner edge portion of the lower end of each pressing rib 3. The step portions 32 of the pressing ribs 31 press the upper peripheral edges and the upper portions of lateral sides of semiconductor devices 34 so that it is tried not to move the devices 34 vertically or horizontally.

As described above, the trays as shown in FIGS. 8a and 8b fix the semiconductor devices 29 and 34 so that it is tried not to move but to fix the semiconductor devices horizontally. In this way, leads extending from the lateral sides of the semiconductor devices do not contact the inner walls of the pockets of the trays.

In the trays 26 and 30 as shown in FIG. 8a and 8b, the semiconductor devices 29 and 34 are pushed downward by the pressing ribs 27 and 31. When many trays are piled up, lower devices are applied with more vertical loads and are likely to be deformed more.

However, the lateral side portions of the lower part of each semiconductor device are not held in the trays 26 and 30 as shown in FIGS. 8a and 8b. Thus, such a problem arises that semiconductor devices are likely to be moved horizontally in the pockets and the leads of the devices are likely contact the inner walls of the pockets and are likely to be damaged, although trial is made to prevent horizontal movement of the devices in the pockets.

SUMMARY OF THE INVENTION

The object of the present invention is to provide a tray for semiconductor devices in which large vertical loads are not applied to semiconductor devices in the tray even if many trays are piled up and in which bottom portion of each semiconductor device is held and leads extending from each semiconductor device are not displaced from the central portion of the pockets even if the upper tray is removed from the lower tray, thereby avoiding deformation and/or damage of the leads.

In order to achieve the object, the present invention provides a tray for semiconductor devices on which at least one tray constituting an upper tray and having the same structure as the tray constituting a lower tray and having an upper surface is piled up on the first mentioned tray when the first mentioned tray is used, comprising:

a plurality of rectangular pockets formed on the upper surface of the tray and each having a center and an inner wall, for housing separately semiconductor devices each having a bottom portion, an upper surface, an undersurface and outer edge portions on the upper surface;

a base projecting upward from each of the pockets, for supporting each of the semiconductor devices, the base having a similar shape to and being substantially larger than the undersurface of the semiconductor device;

parallel guide ribs formed on the undersurface of each of the upper and lower trays and each provided with a tapered inner face inclined downward outward of the base and having a root on the undersurface of the base, the roots of the adjacent guide ribs defining a portion of the undersurface of each of the lower and upper trays which has a similar shape to and is substantially smaller than the upper surface of the semiconductor device, the guide ribs being arranged to provide a horizontal play between the outer edge portions on the upper surface of the semiconductor device and the tapered inner face; and an upwardly projecting holding mechanism extending along the outer edge portions and having a root portion formed on the upper surface of the base and surrounding a portion of the upper surface of the base which has a similar shape to and is not smaller than the undersurface of the semiconductor device, the projecting holding mechanism being arranged to cause the bottom portion of the semiconductor device to be fitted in the portion of the base surrounded by the upwardly projecting holding mechanism.

DETAILED DESCRIPTION OF THE PREFERRED EMBODIMENTS

Embodiments of trays for semiconductor devices according to the present invention will be detailed with reference to FIGS. 1 to 7.

In use, the trays for housing semiconductor devices according to the present invention are piled up. The upper surface of each tray defines a container for receiving a corresponding semiconductor device, and the undersurface of the upper tray functions as a lid for covering the corresponding container of the lower tray.

Figure 1:
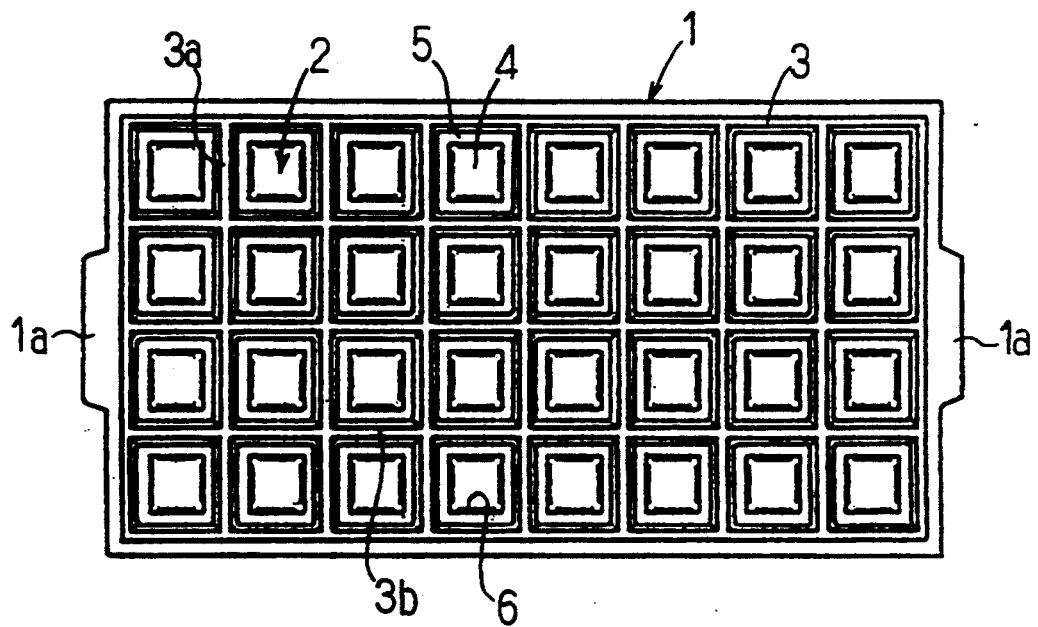
FIG. 1 is a plan view of a first embodiment of a tray according to the present invention.
Figure 2:
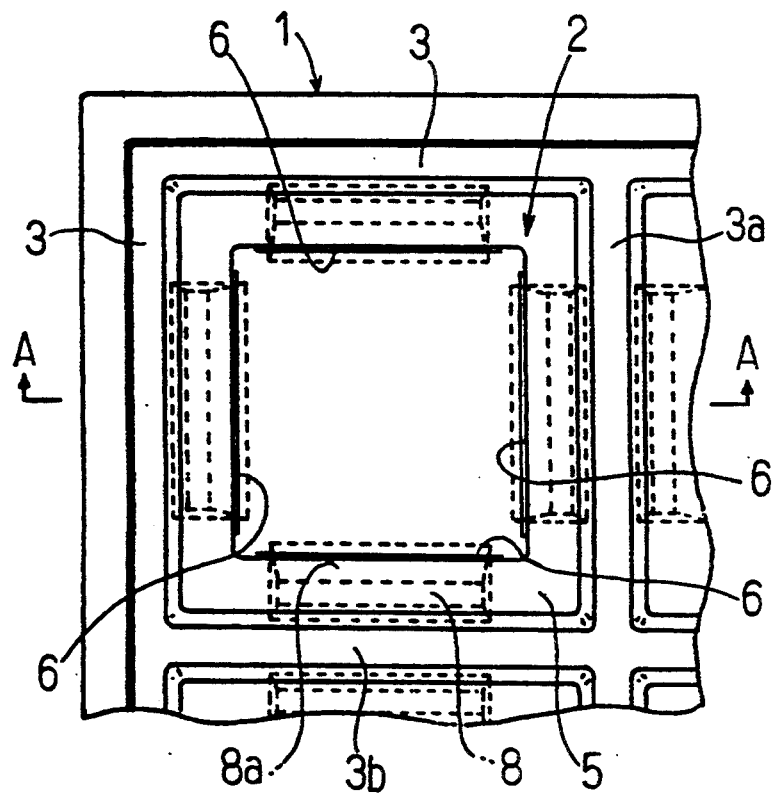
FIG. 2 is an enlarged plan view of the first embodiment.

As shown in FIGS. 1 and 2 are formed many pockets 2 for housing semiconductor devices. Pockets 2 formed in an upward projecting outer frame 3 are divided by longitudinal and transverse partitions 3a and 3b.

A base 4 on which a semiconductor device is mounted is formed in the central portion of each pocket 2. The upper surface of the base 4 is flat and higher than the bottom surface of the pocket 2. A circumferential groove 5 is formed between the base 4 as a party and the outer frame 3 and the partitions 3a and 3b as the other parties.

The outer frame 3 and the partitions 3a and 3b are higher than the upper surface of the semiconductor device mounted on the base 4. The height of the base 4 is selected so that leads extending from the lateral sides of the semiconductor device mounted on the base 4 do not contact the bottom surface of the circumferential groove 5.

On the four edge portions of the upper surface of the base 4 are formed upward projecting ribs 6 each having a semicircular cross section in such a way that the ribs 6 surround the lower portions of the lateral sides of the semiconductor device. The portion of the upper surface of the base 4 which is surrounded by the ribs 6 is similar to and is slightly larger than the bottom of the semiconductor device. More specifically, the rib 6 has dimensions of a radius of not more than 0.15 mm, a height of not more than 0.2 mm and a width of not more than 0.25 mm, for example, so that the rib 6 is completely inserted in the space between a lateral side of the semiconductor device and a lead extending downward at the lateral side of the semiconductor device.

Holding portions 1a are provided for carrying the tray 1.

Downward extending from the undersurface of the tray 1 are an edge frame 7 formed on the entire outer peripheral portion of the tray 1 and guide ribs 8 disposed corresponding to the respective pockets 2.

Figure 3:
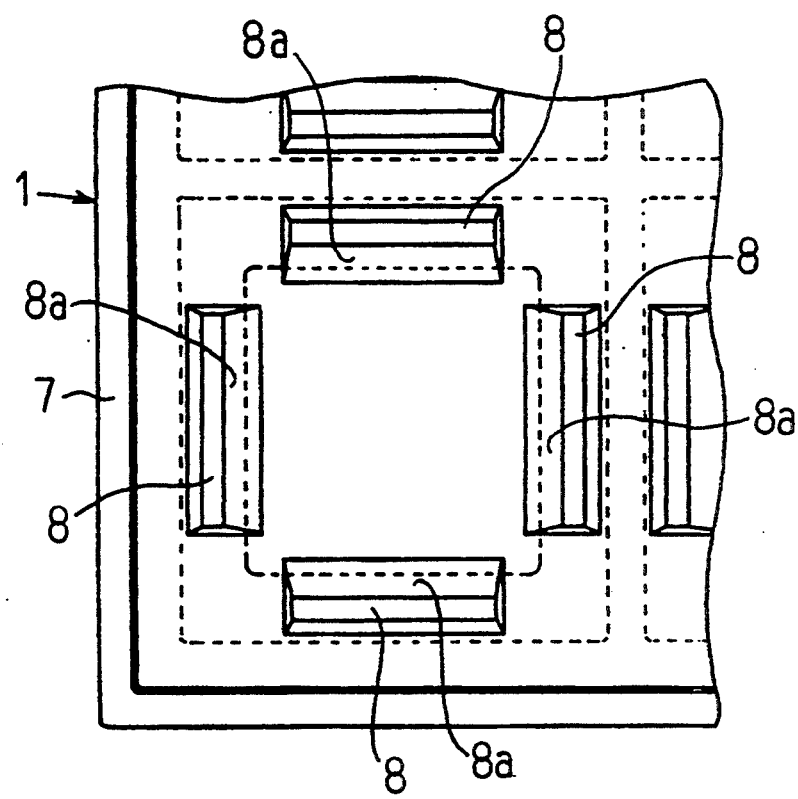
FIG. 3 is an enlarged bottom view of the first embodiment.
Figure 4:
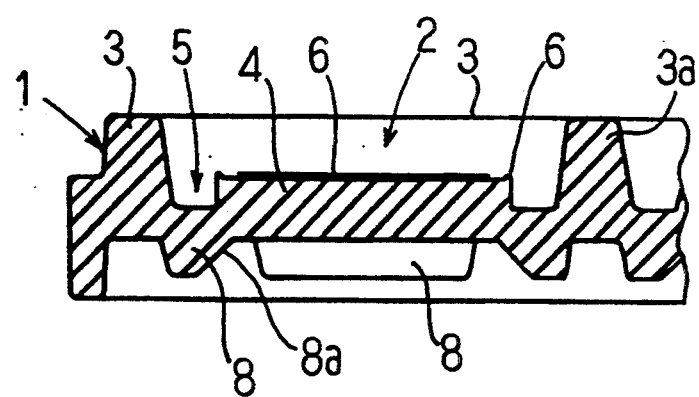
FIG. 4 is a cross-sectional view taken along line A—A in FIG. 2.
Figure 5:
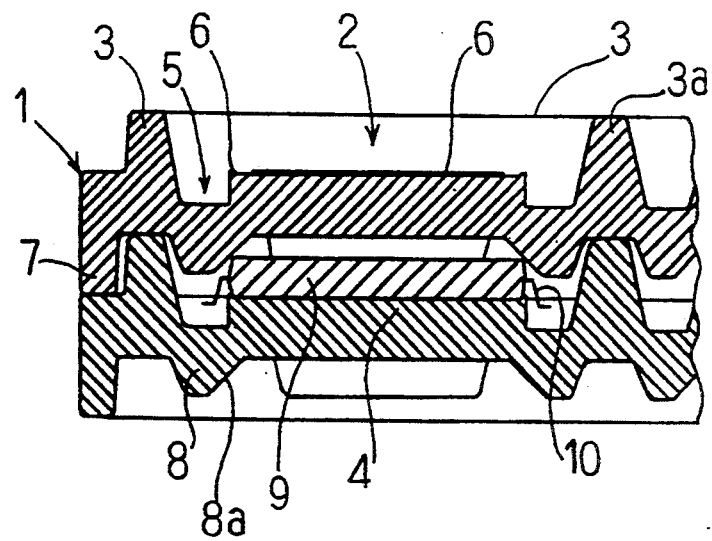
FIG. 5 is a longitudinal cross-sectional view illustrating the state of the tray of the first embodiment in use.

As shown in FIG. 3, four guide ribs 8 are formed corresponding to the four side sections of the circumferential groove 5 of each pocket 2. Each guide rib 8 has a tapered inner face 8a which extends downward and outward in such a way that the distance between the inner faces 8a of the opposed guide ribs 6 becomes wider as they approach their lower ends. The portion of the undersurface of the tray 1 which is surrounded by the roots of the tapered innerfaces 8a is similar to and slightly smaller than the upper surface of the semiconductor device housed in the pocket 2.

The relationships between the portions which comprise the upper surface and the undersurface of the tray 1 will be described with reference to FIG. 6 in which a semiconductor device is mounted on the central portion of a base 4 in a pocket 2 in a tray 1 and covered with another tray 1 by putting said another tray 1 on the first tray 1.

The inclination $\theta_1$ of the tapered inner face 8a with respect to a horizontal line is made sufficiently smaller than the inclination $\theta_2$ of a line formed by connecting an outer edge 9a of the upper surface of a semiconductor device 9 to the bent portion 10a of a corresponding lead 10 at its proximal end with respect to a horizontal line. A horizontal play is provided between the tapered inner face 8a and the corresponding outer edge 9a of the upper surface of the semiconductor device 9 housed in the pocket 2 in the lower tray 1. It is preferred that the play, that is, the horizontal distance between the tapered inner face 8a and the corresponding outer edge 9a of the upper surface of the semiconductor device 9 be not less than 0.025 mm. If the distance is less than 0.025 mm, the vertical load is likely to be applied to the semiconductor device 9.

The horizontal distance between the distal end (free end) 10b of the lead 10 of a semiconductor device 9 housed in a pocket 2 and the corresponding inner wall of the pocket 2 is made larger than the horizontal distance between the tapered inner face 8a and the corresponding outer edge 9a of the upper surface of the semiconductor device 9. Even if shock is applied to the tray 1, the distal end of each lead 10 does not contact the corresponding inner wall of the pocket 2.

The tray 1 for semiconductor devices as constructed as described above will be used in the following way.

Semiconductor devices 9 are mounted on the bases 4 on a tray 1 which will become a lower tray, and another tray which will become an upper tray is put on the first tray 1 with the edge frame 7 fitted on the outer frame 3 of the lower tray 1 so that the edge frame 7 of the upper tray 1 surrounds the outer frame 3 of the lower tray 1.

Figure 6:
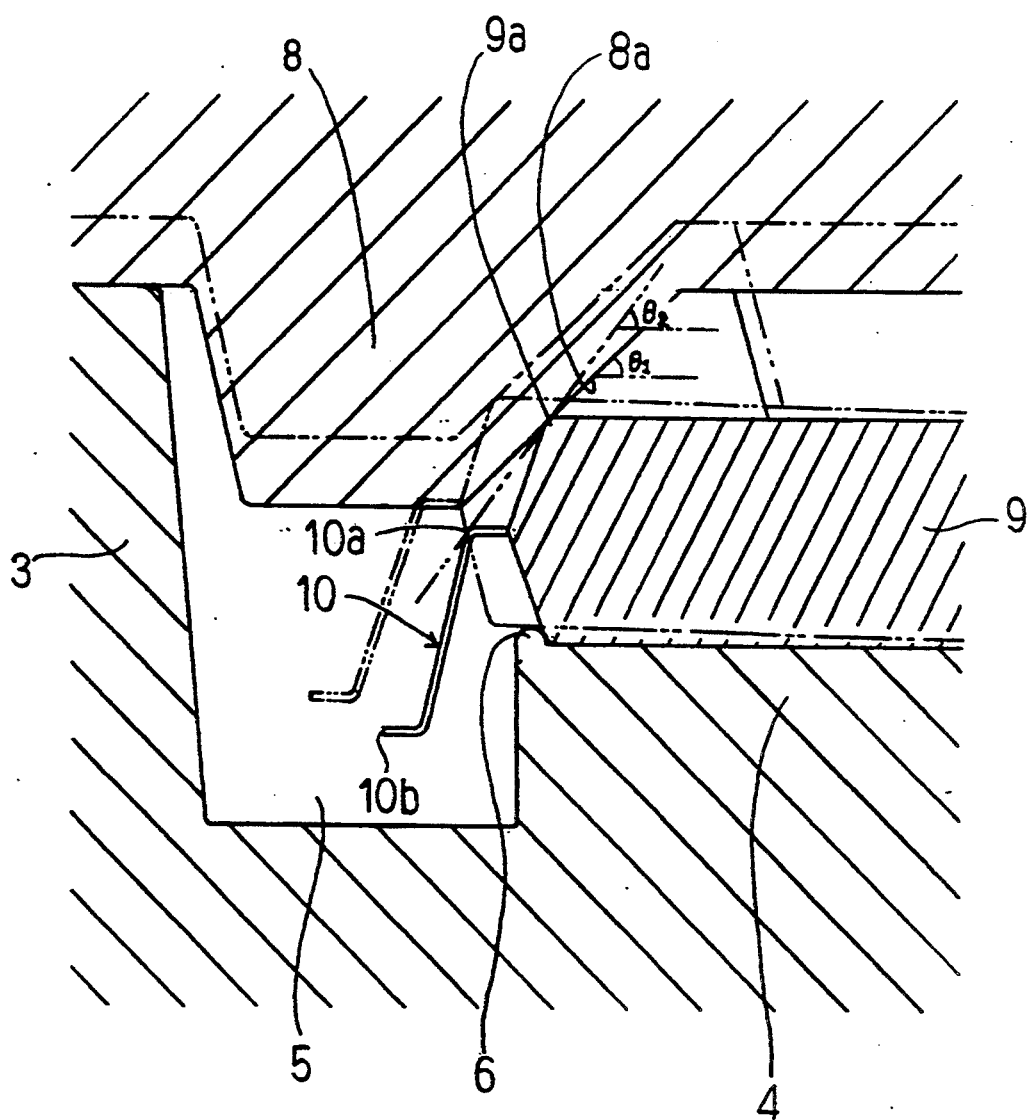
FIG. 6 is an enlarged longitudinal cross-sectional view of the main part of the tray shown in FIG. 5.

When a semiconductor device 9 is loaded on the base 4 in a state displaced from its central portion as shown by imaginary lines in FIG. 6, the tapered inner face 8a of the guide rib 8 contacts the left outer edge 9a of the upper surface of the device 9. As the upper tray 1 is lowered, the tapered inner face 8a pushes the semiconductor device 9 at the left outer edge 9a of its upper surface toward the central portion of the pocket 2. The semiconductor device 9 slides on the base 4 and is moved to the central portion of the pocket 2, as shown in solid lines in FIG. 6.

Each upward projecting rib 6 has a semicircular cross section, and the defined by the bottom face and the lateral side of the semiconductor device 9 is generally rounded. Thus, the bottom portion of the semiconductor device 9 is smoothly fitted in the space surrounded by the upward projecting ribs 6 formed on the upper surface of the base 4 and is set on the central portion of the pocket 2.

Since the inclination $\theta_1$ of the tapered inner face 8a with respect to a horizontal line is smaller than the inclination $\theta_2$ of the line formed by connecting the outer edge 8a of the upper surface of the semiconductor device 9 to the bent portion 10a of the corresponding lead 10 with respect to a horizontal line, the tapered inner face 8a does not contact the lead 10. Thus, lead 10 is not deformed or damaged.

Gaps exist between the upper surface of each semiconductor device 9 in the lower tray 1 and the undersurface of the upper tray 1. In consequence, the semiconductor device 9 is not applied with a vertical load and thus is not deformed thereby.

In the above embodiment, four guide ribs are independently formed on at the portion of the undersurface of the tray which corresponds to each pocket. However, the guide ribs may be rectangularly and continuously connected together or may be formed only portions of the undersurface of the tray which correspond to the four corners of each pocket.

Figure 7A:
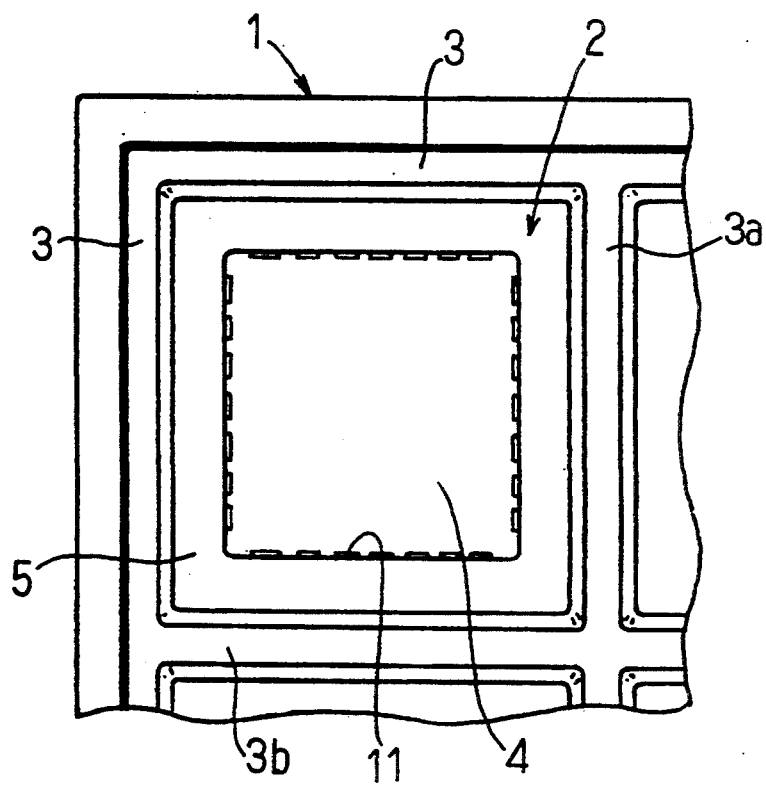
FIG. 7a is an enlarged plan view of a second embodiment of a tray according to the present invention.
Figure 7B:
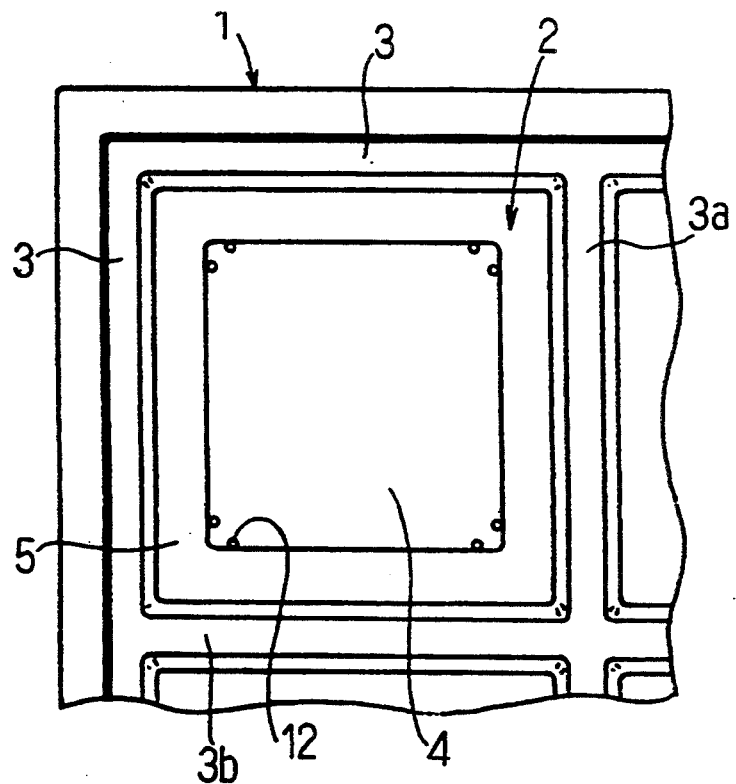
FIG. 7b is an enlarged plan view of a third embodiment of a tray according to the present invention.
Figure 8A:
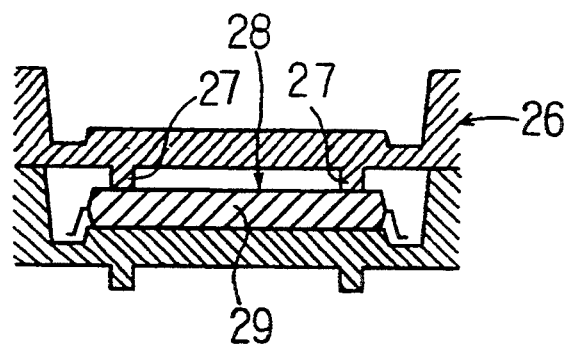
FIG. 8a is a longitudinal cross-sectional view of a conventional tray.
Figure 8B:
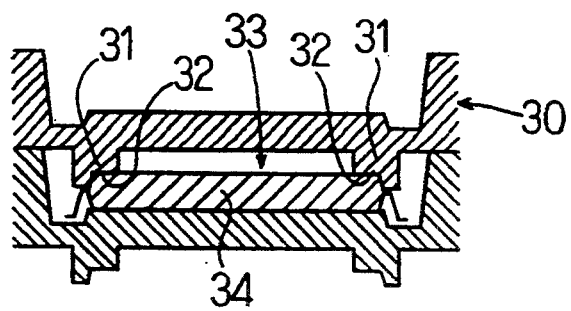
FIG. 8b is a longitudinal cross-sectional view of another conventional tray.

In the embodiment described above, an elongated upward projecting ribs 6 are formed on and along each of the four edge portions on the upper surface of each base 4. Alternatively, discontinuous upward projecting ribs 11 may be formed on and along each of the four edge portions on the upper surface of the each base 4, as shown in FIG. 7a or two hemispherical projections 12 may be formed on the portions of the upper surface of each base 4 which are at each of its four corners.

The tray for semiconductor devices according to the present invention has the following advantages.

When semiconductor devices are mounted on the bases in pockets in the tray in a state in which the devices are displaced from the right places, i.e., the central portions of the pockets, the devices are moved to the right places by being pushed by another tray when said another tray is placed on the first tray from above. In this case, the leads of the devices do not contact the corresponding inner walls of the related pockets, thereby preventing deformation and/or damage of the leads.

Since gaps exist between the upper surface of each semiconductor device housed in the corresponding pocket and the tray put on the lower tray, the semiconductor device is not applied with load and not deformed accordingly.

The bottom portion of the semiconductor device is fitted in a space surrounded by the upward projecting ribs formed on the upper surface of the base, and horizontal movement of the semiconductor device is restricted. Thus, even if the upper tray or trays are removed, the semiconductor devices are not deviated from the central portions of the bases of the lower tray by such mechanical vibration at the assembly location of the semiconductor devices and, therefore, deformation and/or damage of the leads can be prevented.

What is claimed is:

1. A tray for semiconductor devices on which at least one tray constituting an upper tray and having the same structure as said tray constituting a lower tray and having an upper surface is piled up on the first mentioned tray when said lower tray is used, comprising:

a plurality of rectangular pockets formed on said upper surface of each of said upper and lower trays and each having a central portion and an inner wall, each of said pockets housing a semiconductor device having a bottom portion, an upper surface, an undersurface and outer edge portions on said upper surface;

a base projecting upward from each of said pockets, for supporting one of said semiconductor devices, said base having a similar shape to and being substantially larger than said undersurface of each the semiconductor devices;

parallel guide ribs formed on the undersurface of each of said upper and lower trays and each provided with a tapered inner face inclined downward outward of said base and having a root on the undersurface of said base, said roots of the adjacent guide ribs defining a portion of said undersurface of each of said lower and upper trays which has a similar shape to and is substantially smaller than said upper surface of said semiconductor device, said guide ribs being arranged to provide a horizontal play between said outer edge portions on said upper surface of each of said semiconductor devices and said tapered inner face; and upwardly projecting holding means extending along outer edge portions on the upper surface of each of said upper and lower trays and having a root portion formed on the upper surface of said base and surrounding a portion of said upper surface of said base which has a similar shape to and is not smaller than said undersurface of said semiconductor device, said projecting holding means being arranged to cause said bottom portion of said semiconductor device to be fitted in said portion of said base surrounded by said upwardly projecting holding means.

2. A tray according to claim 1, wherein said upward projecting holding means comprises upward projecting ribs arranged along said outer edge portions on said upper surface of each of said upper and lower trays.

3. A tray according to claim 2, wherein each of said upward projecting ribs continuously extends along the respective one of said outer edge portions.

4. A tray according to claim 3, wherein said upward projecting ribs are separately formed on the respective outer edge portions.

5. A tray according to claim 3, wherein each of said upper projecting ribs has both ends and the adjacent ends of the adjacent upper projecting ribs are connected together.

6. A tray according to claim 2, wherein said upward projecting ribs are formed discontinuously on each of said outer edge portions.

7. A tray according to claim 2, wherein each of said upward projecting ribs has a semicircular cross section.

8. A tray according to claim 1, wherein said holding means comprises a pair of projections formed at each of corners of said upper surface of each of said upper and lower trays.

9. A tray according to claim 8, wherein each of said projections has a hemispherical shape.

10. A tray according to claim 1, wherein said semiconductor device has upper outer edges is provided with leads extending externally from lateral sides of each of said semiconductor devices and a bent portion at which each of said leads is bent downward, and said inclined inner face is inclined at a first angle with respect to a horizontal line which first angle is sufficiently smaller than a second angle defined by a line connecting each of said outer edges of said semiconductor device to said bent portion of corresponding one of said leads with respect to a horizontal line.

* * * * *